(12) United States Patent
Launay et al.

(10) Patent No.: US 9,367,791 B2
(45) Date of Patent: Jun. 14, 2016

(54) TRANSPONDER INLAY AND DEVICE INCLUDING SUCH AN INLAY

(75) Inventors: François Launay, Vitre (FR); Loïc Le Garrec, Chateaubourg (FR)

(73) Assignee: OBERTHUR TECHNOLOGIES, Levallois-Perret (FR)

(*) Notice: Subject to any disclaimer, the term of this patent is extended or adjusted under 35 U.S.C. 154(b) by 0 days.

(21) Appl. No.: 13/186,377

(22) Filed: Jul. 19, 2011

(65) Prior Publication Data

US 2012/0024960 A1 Feb. 2, 2012

(30) Foreign Application Priority Data

Jul. 20, 2010 (FR) ...................... 10 55890

(51) Int. Cl.
*G06K 19/077* (2006.01)
*G06K 19/02* (2006.01)

(52) U.S. Cl.
CPC ........ *G06K 19/07745* (2013.01); *G06K 19/025* (2013.01); *G06K 19/07747* (2013.01); *G06K 19/07749* (2013.01); *G06K 19/07775* (2013.01); *G06K 19/07779* (2013.01); *H01L 2224/16225* (2013.01); *H01L 2224/48091* (2013.01); *H01L 2224/48227* (2013.01)

(58) Field of Classification Search
CPC .................. G06K 19/07745; G06K 19/07779; G06K 19/07783
USPC ................................................. 235/488, 492
See application file for complete search history.

(56) References Cited

U.S. PATENT DOCUMENTS

| | | | |
|---|---|---|---|
| 5,965,867 A * | 10/1999 | Haghiri-Tehrani | 235/492 |
| 6,320,753 B1 * | 11/2001 | Launay | 361/760 |
| 6,353,420 B1 * | 3/2002 | Chung | 343/895 |
| 6,372,541 B1 * | 4/2002 | Bouchez et al. | 438/106 |
| 6,839,963 B1 * | 1/2005 | Haghiri-Tehrani et al. | 29/852 |
| 7,243,854 B2 * | 7/2007 | Launay | 235/492 |
| 8,056,819 B2 * | 11/2011 | Rowell et al. | 235/492 |
| 2003/0168514 A1 * | 9/2003 | Rancien et al. | 235/492 |
| 2009/0294534 A1 * | 12/2009 | Pepori et al. | 235/439 |
| 2009/0315320 A1 * | 12/2009 | Finn | 283/107 |
| 2010/0025477 A1 * | 2/2010 | Deloche et al. | 235/488 |

FOREIGN PATENT DOCUMENTS

| | | |
|---|---|---|
| DE | 10 2008 022 016 | 11/2009 |
| FR | 2915010 | 10/2008 |
| WO | WO 2005/088704 | 9/2005 |
| WO | WO 2006048577 A1 * | 5/2006 |

* cited by examiner

*Primary Examiner* — Toan Ly
(74) *Attorney, Agent, or Firm* — Cozen O'Connor

(57) ABSTRACT

The inlay (10) for the manufacture of a device (12) comprising a base made up of a multilayer structure within which the inlay (10) is designed to be incorporated, the insert (10) comprising a microcircuit and an antenna connected to the microcircuit. The transponder assembly is combined into a microcircuit module (26) and the substrate includes a cavity (28) dimensioned to completely receive the module (26).

6 Claims, 1 Drawing Sheet

TRANSPONDER INLAY AND DEVICE INCLUDING SUCH AN INLAY

RELATED APPLICATIONS

This application claims the priority of French application no. 10/55890 filed Jul. 20, 2010, the disclosure content of which is hereby incorporated by reference.

FIELD OF THE INVENTION

The present invention relates to the technical field of electronic devices of the contactless type comprising a near-field communication antenna for establishing communication with an external reader terminal.

Such devices are generally portable and wireless and are capable of exchanging data with the external reader terminal.

The invention applies more particularly to electronic devices such as a chip card or a passport page.

BACKGROUND OF THE INVENTION

It is known in the state of the art to manufacture a passport page with a multilayer structure within which an insert is incorporated.

An inlay is generally incorporated between two layers of a multilayer structure constituting a base of the contactless device. The inlay generally includes a substrate and a transponder assembly consisting of an antenna and a microcircuit connected to the antenna. Customarily, the antenna and the microcircuit are directly incorporated into the substrate and the antenna follows the outside perimeter of the substrate. Thus the chip (or microcircuit) and the antenna are housed in the thickness of the multilayer structure constituting the passport page.

The antenna is for example an antenna for remote transmission of information, of signals and/or of energy which is made up for example of a winding of electronically conductive coils made for example by printing with a conductive ink on one face of the inlay, and the antenna is electrically connected to the microcircuit.

In the case of a passport, the inlay is for instance interleaved between the cover and the flyleaf, the assembly then being laminated to constitute a single page of the passport, for example by cold gluing, hot laminating between the cover and the flyleaf.

The microcircuit has connection terminals which are designed to come into direct contact with the connection studs of the antenna incorporated into the inlay.

Likewise, a microcircuit card is manufactured starting with a multilayer structure in which the inlay is also incorporated which allows the microcircuit and the antenna to be housed within the thickness of the card.

Such a manufacturing process proves to be particularly complex to carry out due to the connection between the antenna and the microcircuit which must be as reliable as possible to avoid unwanted disconnections of the antenna from the microcircuit which can make the card or the passport inoperable.

Indeed it is necessary, particularly for official documents such as passports, that the lifetime of such a document be sufficiently long to cover the duration of validity of the certification defined by the passport.

SUMMARY OF THE INVENTION

One object of the invention is to provide a contactless device such as a passport or a microcircuit card that is simple to manufacture and reliable.

To this end, one aspect of the invention is directed to a transponder inlay for manufacturing a device comprising a base consisting of a multilayer structure within which the inlay is designed to be incorporated, the insert comprising a substrate and a transponder assembly comprising a microcircuit and an antenna connected to the microcircuit, characterized in that the transponder assembly is combined into a microcircuit module and in that the substrate includes a cavity dimensioned to completely receive the module.

An inlay according to an embodiment of the invention can also include one or more of the following features:
- the substrate delimits first and second opposite faces, the cavity opening onto one of the faces;
- the module includes a base bearing the microcircuit and the antenna;
- the cavity being delimited by a bottom and a peripheral wall, the microcircuit is carried by the base facing the bottom of the cavity;
- the antenna consists of a winding of electrically conductive coils;
- the antenna extends along the periphery of the module base;
- the microcircuit is mounted "flip-chip" fashion within the module.

Another aspect of the invention is directed to a device comprising a base consisting of a layered structure comprising at least three layers, an intermediate layer interleaved between two outside layers, characterized in that the intermediate layer is an inlay according to the invention.

Preferably, the layers are bonded to one another by lamination to form a laminated base.

In a preferred embodiment, the device is a passport or a microcircuit card.

BRIEF DESCRIPTION OF THE DRAWINGS

Other features and advantages of the invention will appear in the light of the description that follows, made with reference to the appended drawings in which.

DETAILED DESCRIPTION OF THE DRAWINGS

Figure 1:
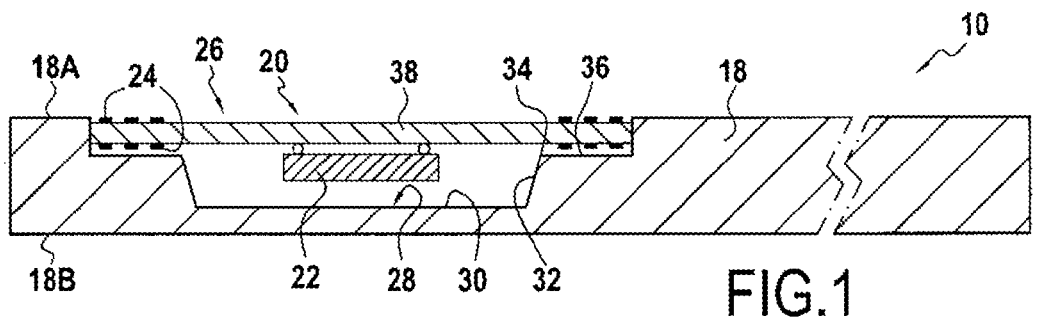
FIG. 1 shows an inlay according to the invention.

An inlay according to a first embodiment of the invention is shown in FIG. 1. This inlay is designated with the general reference number 10.

The inlay 10 is intended for the manufacture of a device 12 comprising a base made up of a multilayer structure within which the inlay 10 is designed to be incorporated. Such a device 12 is for example a microcircuit card 14 (FIG. 3) or a passport 16 (FIG. 4).

The inlay 10 comprises, as shown in FIG. 1, a substrate 18 and a transponder assembly 20 comprising a microcircuit 22 and an antenna 24 connected to the microcircuit 22.

The transponder assembly 20 is, in conformity with the invention, combined into a microcircuit module 26. The substrate 18 is made for example of a polymer material such as polyvinyl chloride (PVC), polyester (PET, PETG), polycarbonate (PC), ABS, etc.

Further, in conformity with the invention, the substrate 18 includes a cavity 28 for receiving the module 26 which is dimensioned to completely receive the module 26, for example within its thickness. For example, the thickness of the substrate 18 is less than 600 micrometers and preferably comprised between 300 and 600 micrometers.

Preferably, the substrate 18 delimits first 18A and second 18B opposite faces, and the cavity 28 opens onto one of these faces, for example the face 18A.

The cavity 28 is delimited in this example by a bottom 30 and a peripheral wall 32 surrounding the bottom. This peripheral wall 32 comprises, in the example described, a terrace 34 forming an internal peripheral edge 36 that is raised with respect to the bottom 30.

Thus, the cavity 28 comprises a deep area delimited by the bottom 34 and the part of the peripheral wall below the terrace 34 and an area raised with respect to the deep area delimited by the inner peripheral edge 36 and the upper part of the peripheral wall with respect to the terrace 34.

Preferably, the module 26 includes a base 38. This base 38 is for example made of a material consisting essentially of epoxy and has for example a thickness less than 200 micrometers and preferably comprised between 70 and 100 micrometers. The base 38 rests for example on the inner edge 36.

Preferably, as illustrated in the first embodiment, the microcircuit 22 is assembled by chip transfer and is said to be "flip-chip" mounted in the module 26. This assembly method is characterized by direct electrical connection of the active face of the microcircuit 22 onto the base for electrical connection to the appropriate conductors on the base.

Figure 2:
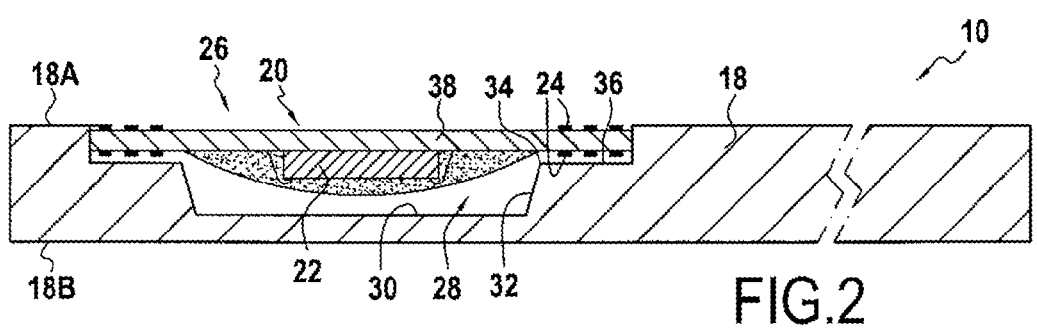
FIG. 2 shows an inlay according to a variation of the inlay of FIG. 1.

In a variation illustrated in FIG. 2, the microcircuit can be mounted into the base by a cabling process called "wire bonding" which consists of gluing the microcircuit to the base by its passive face and to cable the microcircuit from its active face for its electrical connection. In this case, the microcircuit and the cables are for example encapsulated in a shell of polymer resin.

Further, the antenna 24 extends around the microcircuit 22 along the periphery of the base 38.

Preferably, as illustrated in FIG. 1, the antenna 24 extends in two parts on each of the faces of the base 38 of the module 26.

Figure 3:
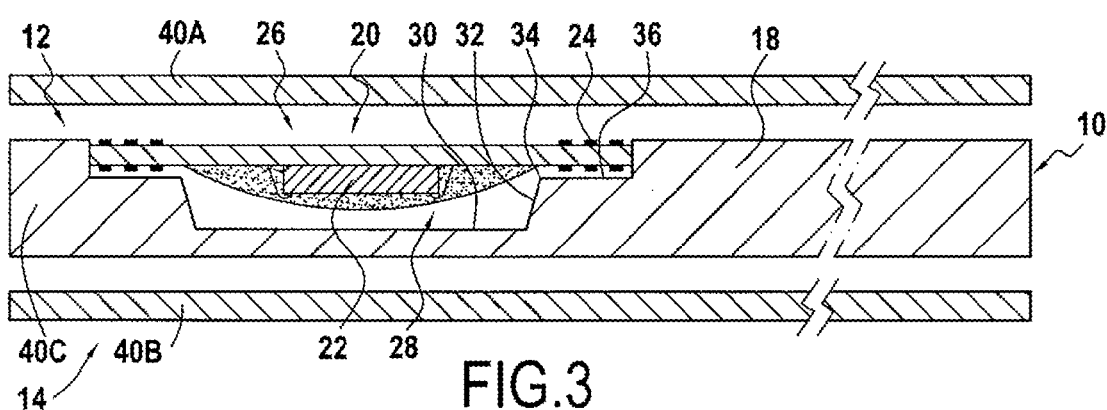
FIG. 3 shows a contactless type microcircuit card including the inlay shown in FIG. 2.
Figure 4:
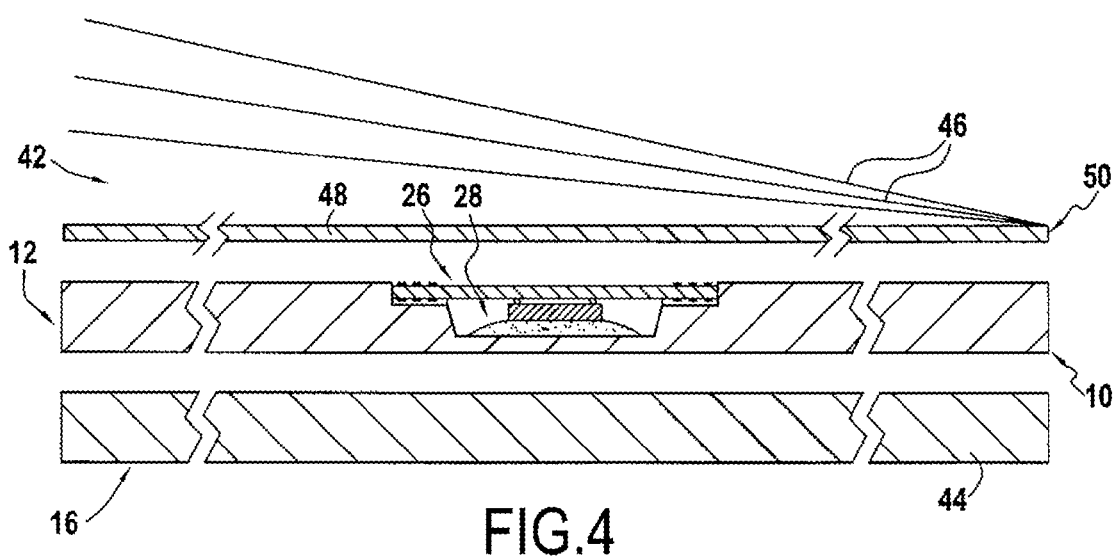
FIG. 4 shows a passport with a contactless type function including the inlay of FIG. 1.

The device 12 of FIG. 3 is a microcircuit card 14. For example, the microcircuit card 14 is compliant with the ISO 7816 standard and its format is the ID-1 format of the same standard.

The card 14 comprises a body 40 consisting of a multilayer structure comprising at least three layers, an intermediate layer 40C interleaved between two outer layers 40A, 40B.

The intermediate layer 40C is constituted by the inlay 10 of FIG. 2 and is interleaved between the two outside layers 40A, 40B which constitute the thickness compensation layers allowing the irregularities of the surface of the inlay 10 to be compensated.

Preferably, the layers 40A, 40B, 40C are bonded together by lamination.

The device 12 shown in FIG. 4 is a passport 16 comprising a booklet 42 provided with a cover 44 and a set of sheets 46 comprising among others a flyleaf 48. The sheets 46 and the cover 44 are bound together by a binding line 50.

In FIG. 4, it is seen that the inlay 10 is interleaved between the cover 44 and the flyleaf 48 to form a multilayer structure. It is seen in this figure that the microcircuit is mounted according to the "flip-chip" assembly process. Further, in this example, the microcircuit is glued to the bottom of the cavity. Of course, as a variation, the microcircuit can also be mounted by wire bonding.

Preferably, the thickness of the inlay 10 is limited by the height of the module 26 as well as the thickness of the thinned part constituting the bottom of the cavity 28.

It is well understood that the embodiments that have just been described are not limiting in nature and that they can receive any desirable modification without thereby departing from the scope of the invention. In particular, it would be in conformity with the invention to incorporate an inlay in any transponder type device.

The invention claimed is:

1. A method of making a device comprising a multilayer structure including a transponder, comprising:
    a step of preparing a transponder assembly comprising a microcircuit and an antenna connected to the microcircuit, wherein the transponder assembly is combined into a microcircuit module comprising a base having faces bearing the microcircuit and the antenna, the antenna extending in two parts on each of the faces of the base, the base having a thickness between 70 and 100 micrometers,
    a step, before receiving the transponder assembly, of preparing a substrate having a cavity dimensioned to completely receive the transponder assembly,
    a step of preparing a transponder inlay by completely receiving the module in the cavity, and
    a step of incorporating, subsequent to the receiving of the module in the cavity, the transponder inlay within the multilayer structure, the transponder inlay being interleaved between two outside layers, these two outside layers being thickness compensation layers.

2. The method according to claim 1, wherein the substrate delimits first and second opposite faces, the cavity opening onto one of the faces and having a thinned part constituting a bottom of the cavity, and wherein the base rests on an edge of the cavity.

3. A method according to claim 2, wherein the cavity comprises an inner edge that is raised with respect to the bottom of the cavity, and the step of preparing the transponder inlay comprises inserting the transponder in the cavity so that the microcircuit faces the bottom of the cavity and the base rests on the inner edge.

4. The method according to claim 1, wherein the layers of the multilayer structure are bonded to one another by lamination to form a laminated base.

5. The method according to claim 1, wherein the substrate is integral.

6. A method of making according to claim 1, wherein the substrate is in a polymer material.

* * * * *